(12) United States Patent
Kawanishi et al.

(10) Patent No.: US 8,208,510 B2
(45) Date of Patent: Jun. 26, 2012

(54) SEMICONDUCTOR LASER DEVICE AND HEAT SINK USED THEREIN

(75) Inventors: Hidekazu Kawanishi, Kanagawa (JP); Kenji Sasaki, Kanagawa (JP); Yuichi Hamaguchi, Tokyo (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 11/279,279

(22) Filed: Apr. 11, 2006

(65) Prior Publication Data

US 2006/0227827 A1    Oct. 12, 2006

(30) Foreign Application Priority Data

Apr. 12, 2005    (JP) ................ P2005-115118

(51) Int. Cl.
*H01S 5/22* (2006.01)
*H01S 5/24* (2006.01)
(52) U.S. Cl. .............. 372/35; 372/36; 438/122
(58) Field of Classification Search .......... 372/35, 372/36; 438/122
See application file for complete search history.

(56) References Cited

U.S. PATENT DOCUMENTS

| | | | | |
|---|---|---|---|---|
| 5,105,429 A | * | 4/1992 | Mundinger et al. | 372/34 |
| 5,294,830 A | * | 3/1994 | Young et al. | 257/714 |
| 5,903,583 A | * | 5/1999 | Ullman et al. | 372/35 |
| 6,097,744 A | * | 8/2000 | Takigawa et al. | 372/34 |
| 6,970,485 B1 | * | 11/2005 | Kitayama et al. | 372/35 |
| 2001/0048698 A1 | * | 12/2001 | Lorenzen et al. | 372/36 |
| 2004/0264519 A1 | * | 12/2004 | Morrell | 372/35 |

FOREIGN PATENT DOCUMENTS

| | | | |
|---|---|---|---|
| DE | 4315580 | * | 11/1994 |
| JP | 1998 209531 | | 8/1998 |
| JP | 2001 160649 | | 6/2001 |
| JP | 2001 291925 | | 10/2001 |
| JP | 2003 273441 | | 9/2003 |
| JP | 2004 186527 | | 7/2004 |
| JP | 2004-186527 A | | 7/2004 |
| WO | WO02 35666 | | 5/2002 |

OTHER PUBLICATIONS

Japanese Office Action dated Nov. 29, 2010 for JP Application No. 2005-115118.

* cited by examiner

*Primary Examiner* — Jessica Stultz
*Assistant Examiner* — Michael Carter
(74) *Attorney, Agent, or Firm* — SNR Denton US LLP

(57) ABSTRACT

A semiconductor laser device has a heat sink of which multiple laminated plates are constituted and a semiconductor laser element mounted on upper surface of the heat sink. The heat sink has a channel in which a coolant flows inside thereof. The heat sink includes a channel-forming plate portion that forms the channel and a mounting plate portion that forms an upper surface of the heat sink that comes into contact with the channel. The mounting plate portion is made of material having a thermal expansion coefficient, which is closer to that of the semiconductor laser element than that of the channel-forming plate portion.

11 Claims, 4 Drawing Sheets

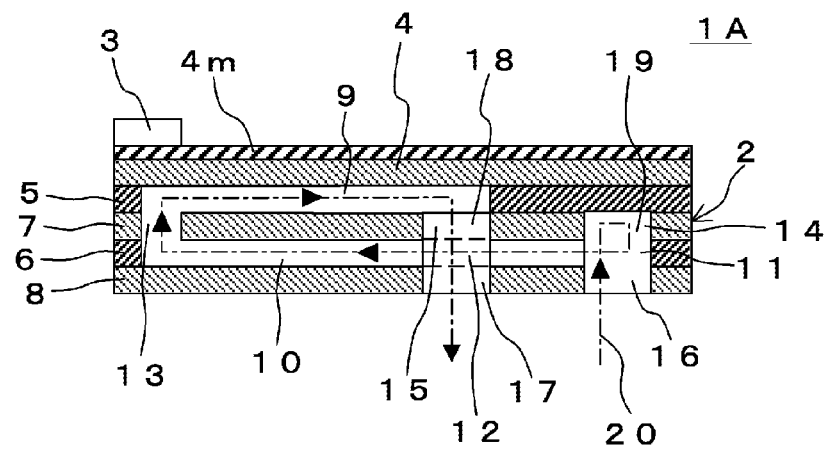
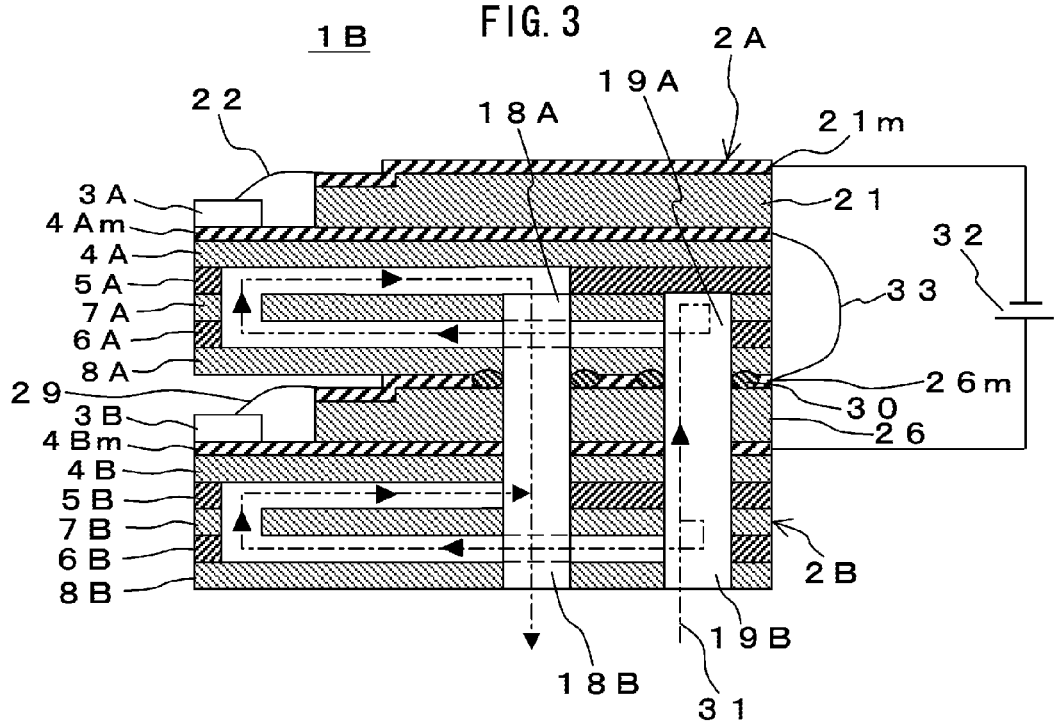

SEMICONDUCTOR LASER DEVICE AND HEAT SINK USED THEREIN

The present invention contains subject matter related to Japanese Patent Application No. JP2005-115118 filed in the Japanese Patent Office on Apr. 12, 2005, the entire contents of which being incorporated herein by reference.

BACKGROUND OF THE INVENTION

1. Field of the Invention

This invention relates to a semiconductor laser device and a heat sink used therein.

2. Description of Related Art

A semiconductor laser device in a range from several watts to a few tens watts has often used a water-cooled system therein in order to implement high-power and high-reliability. Micro channels are well known as heat sink structures because they increase heat-removing efficiency.

Fine interior channel structures such as micro channels are typically formed by etching a pattern onto thin metal plates and laminating the plates together. Diffusion bonding or brazing is generally used to bond the thin metal plates together. As Copper plates are commonly used as the thin metal plates because they have excellent thermal conductivity and easy machinability.

Copper has a thermal expansion coefficient of, $17*10^{-6}$/k while a substrate of gallium arsenide, which is generally used in a high-power semiconductor laser device, has a thermal expansion coefficient of, $5.9*10^{-6}$/k. This large difference between the thermal expansion coefficients causes a stress to occur when a semiconductor laser chip is fixed to a heat sink with solder and then they are cooled to the normal temperature.

It is known that, turning on electricity through the semiconductor laser chip with any stress occurring in the chip, accelerates the number of crystalline defects, thereby reducing the reliability of the laser.

In order to solve the problem, a soft solder, for example, indium solder is used or a sub mount made of copper tungsten or the like, which has a thermal expansion coefficient close to that of the semiconductor laser chip, is inserted into a position between the heat sink and the laser chip (see Japanese Patent Application Publication No. 2004-186527).

SUMMARY OF THE INVENTION

If the indium solder is used for bonding the semiconductor laser chip, the solder may weaken due to alloyed indium solder when turning on electricity through the semiconductor laser chip for a long time and hence, reliability of the chip deteriorates. If the sub mount is inserted into the position between the heat sink and the chip, heat-removing efficiency decreases based on the thermal resistance in the sub mount.

Heat sinks using micro channels have a structure such that by increasing a velocity of water flowing just under the chip, the heat removing efficiency is improved However, corrosion of the metal material may occur at this point, thereby causing water to leak therefrom.

If the semiconductor laser device is a stack type, such that multiple sets of water-cooled members are stacked, any corrosion that occurs electrically due to any difference in potential of the two adjacent heat sinks, thereby causes a part of the heat sink that is near the water channel to decrease in thickness due to corrosion and water to leak therefrom.

It is desirable to present a semiconductor laser device and a heat sink used therein that can prevent any stress from occurring without decreasing heat-removing efficiency.

According to an embodiment of the present invention, there is a semiconductor laser device having a heat sink including multiple laminated plates and a semiconductor laser element mounted on an upper surface of the heat sink. The heat sink has a channel in which a coolant, for example, water flows inside thereof. The heat sink includes a channel-forming plate portion that forms the channel and a mounting plate portion that forms an upper surface of the heat sink that comes into contact with the channel. The mounting plate portion is made of material having a thermal expansion coefficient, which is closer to that of the semiconductor laser element than that of the channel-forming plate portion.

According to another embodiment of the present invention, there is a heat sink including multiple laminated plates and a channel in which a coolant flows inside thereof. A semiconductor laser element is mounted on a surface of the heat sink. The heat sink includes a channel-forming plate portion that forms the channel and a mounting plate portion that forms an upper surface of the heat sink that comes into contact with the channel. The mounting plate portion is made of material having a thermal expansion coefficient, which is closer to that of the semiconductor laser element than that of the channel-forming plate portion.

According to any embodiments of the invention, heat generated when driving the semiconductor laser element is transferred to the heat sink. The heat sink having a channel in which a coolant, for example, water, flows inside thereof removes the heat received from the semiconductor laser element. This allows the semiconductor laser element to be cooled.

In the heat sink, the mounting plate portion on which the semiconductor laser element is mounted is made of material having a thermal expansion coefficient, which is closer to that of the semiconductor laser element than that of the channel-forming plate portion. This allows any stress generated in the semiconductor laser element to be reduced when expanding and contracting the semiconductor laser element and the mounting plate portion based on the heat generated from driving the semiconductor laser element.

Thus, according to any embodiments of the invention, any stress generated in the semiconductor laser element can be reduced, and hence, reliability of the semiconductor laser element can be improved. Since a whole upper surface of the heat sink can be made of a single type of material in any embodiments of the invention, it is possible to prevent a decrease in heat-removing efficiency based on the thermal resistance.

Since the mounting plate portion on which the semiconductor laser element is mounted is made of material, for example, insulating material, having a thermal expansion coefficient, which is closer to that of the semiconductor laser element, in the embodiment of the heat sink, it is possible to avoid any corrosion occurring on a part of the heat sink that is in contact with the channel, thus preventing water from leaking therefrom.

The concluding portion of this specification particularly points out and directly claims the subject matter of the present invention. However those skilled in the art will best understand both the organization and method of operation of the invention, together with further advantages and objects thereof, by reading the remaining portions of the specification

BRIEF DESCRIPTION OF THE DRAWINGS

FIG. 2 is a sectional side view of the embodiment of the semiconductor laser device according to the invention for illustrating a configuration thereof;

FIG. 3 is a sectional side view of another embodiment of a semiconductor laser device according to the invention;

DESCRIPTION OF THE PREFERRED EMBODIMENTS

The following will describe embodiments of semiconductor laser device and heat sink according to the invention with reference to the accompanying drawings.

(A Configuration of First Embodiment of Semiconductor Laser Device According to the Invention)

Figure 1:
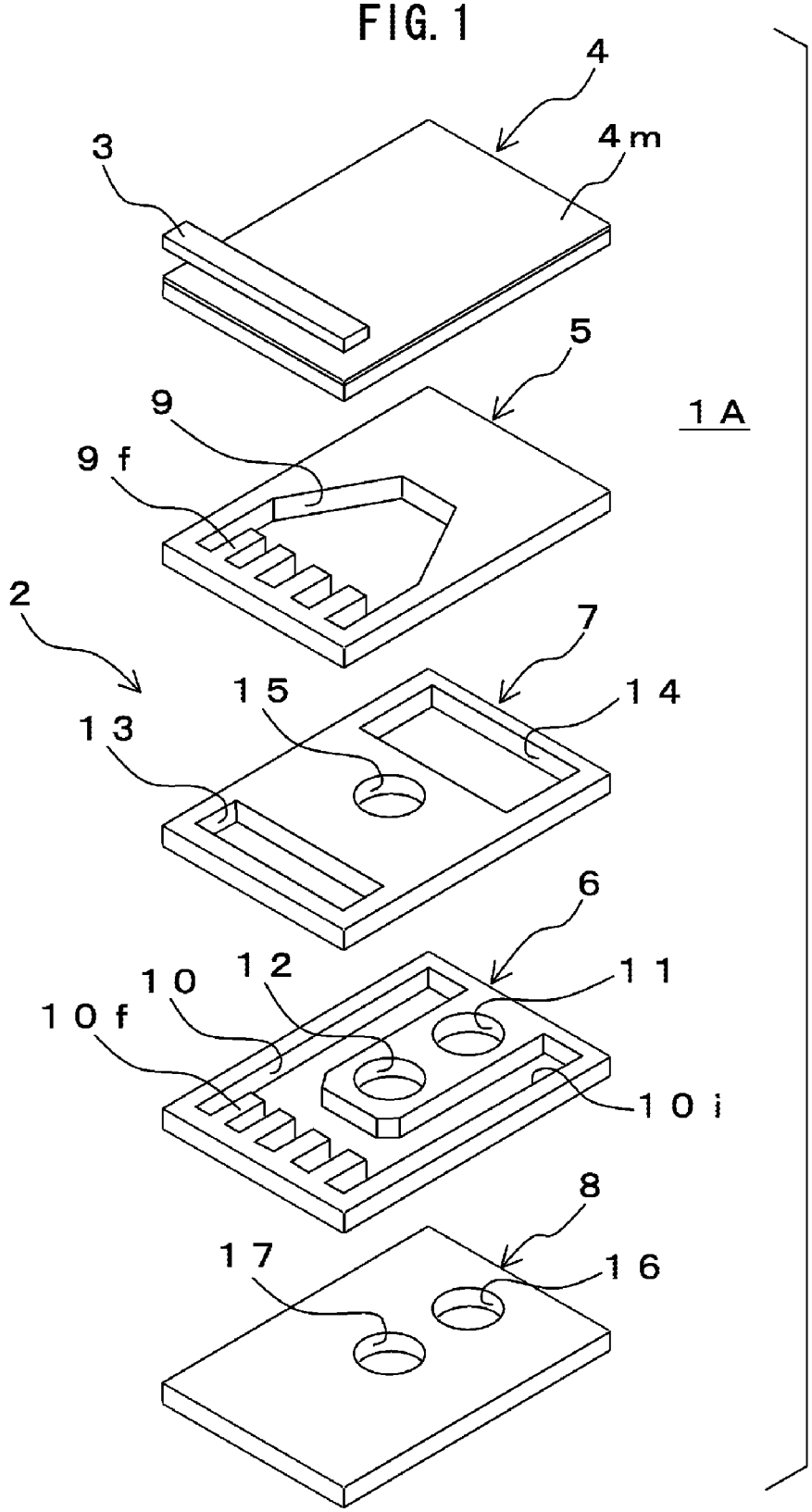
FIG. 1 is an expanded view of an embodiment of a semiconductor laser device according to the invention for illustrating a configuration thereof.

FIG. 1 is an expanded view of a first embodiment of each of the semiconductor laser device and the heat sink used therein according to the invention for illustrating a configuration thereof FIG. 2 is a sectional side elevation of the first embodiment of the semiconductor laser device according to the invention for illustrating a configuration thereof.

A first embodiment of the semiconductor laser device 1A contains a heat sink 2 having a fine channel structure of micro channel type and a semiconductor laser chip 3 mounted thereon. This embodiment of the heat sink 2 includes laminated thin plates. In this embodiment, the heat sink 2 includes the following plates as five layers: a laser-chip-mounting plate 4 as a first layer; radiation-fin-forming plates 5, 6 as second and fourth layers; and channel-forming plates 7, 8 as third and fifth layers. The plates are bonded together using diffusion bonding or the like to form the heat sink 2.

The laser-chip-mounting plate 4 is an example of the mounting plate portion. The laser-chip-mounting plate 4 is a thin plate on which the semiconductor laser chip 3 is mounted. The laser-chip-mounting plate 4 is made of material having a thermal expansion coefficient, which is closer to that of material of the semiconductor laser chip 3. If the semiconductor laser chip 3 is made of substrate of gallium arsenide that is generally used, the laser-chip-mounting plate 4 is made of metallic material such as Kovar or copper-tungsten alloy or a ceramic such as aluminum nitride or silicon carbide.

If the laser-chip-mounting plate 4 is made of ceramic that is an insulating material, a metal layer 4m is formed on a surface thereof using rolled gold so that the metal layer 4m and an electrode formed on a lower surface of the semiconductor laser chip 3 can be connected electrically.

The radiation-fin-forming plate 5 is an example of the channel-forming plate portion. The radiation-fin-forming plate 5 is made of, for example, material having higher thermal conductivity. The radiation-fin-forming plate 5 has a radiation-fin-forming channel 9 therein.

The radiation-fin-forming plate 6 is an example of the channel-forming plate portion. The radiation-fin-forming plate 6 is made of, for example, material having higher thermal conductivity, similar to a case of the radiation-fin-forming plate 5. The radiation-fin-forming plate 6 has a radiation-fin-forming channel 10, a coolant-supply-channel-forming opening 11, and a coolant-discharge-channel forming opening 12 therein. In this case, if the laser-chip-mounting plate 4 is made of ceramic, the radiation-fin-forming plates 5, 6 are made of copper or the like that has excellent thermal conductivity and is capable of diffusion-bonding to the ceramic.

The radiation-fin-forming channel 9 is formed in the radiation-fin-forming plate 5 so that it passes through the radiation-fin-forming plate 5 in a vertical direction thereof. Plural radiation fins 9f are arranged so as to be positioned under the semiconductor laser chip 3 and are projected in a line toward the inside of the channel 9 and hence, a coolant flows in a space between the radiation fins 9f in the radiation-fin-forming channel 9.

The radiation-fin-forming channel 10 is formed in the radiation-fin-forming plate 6 so that it passes through the radiation-fin-forming plate 6 in a vertical direction thereof. Multiple radiation fins 10f are arranged so as to be positioned under the semiconductor laser chip 3 are projected in a line toward the inside of the channel 10 and hence, a coolant flows in a space between the radiation fins 10f in the radiation-fin-forming channel 10. The radiation-fin-forming channel 10 lengthens to form a coolant-supply channel 10i for supplying a coolant to the radiation fins 10f.

The coolant-supply-channel forming opening 11 and the coolant-discharge-channel forming opening 12 are respectively formed in the radiation-fin-forming plate 6 so that they pass through the radiation-fin-forming plate 6 in a vertical direction thereof. These openings 11, 12 are separately formed from the radiation-fin-forming channel 10 in the radiation-fin-forming plate 6.

The channel-forming plate 7 is an example of the channel-forming plate portion. The channel-forming plate 7 is made of the same material as that of the laser-chip-mounting plate 4. The channel-forming plate 7 has a circulation channel 13, a coolant-supply-channel forming opening 14, and a coolant-discharge-channel forming opening 15 therein.

The channel-forming plate 8 is an example of the channel-forming plate portion. The channel-forming plate 8 is made of the same material as that of the laser-chip-mounting plate 4, similar to a case of the channel-forming plate 7. The channel-forming plate 8 has a coolant-supply-channel forming opening 16 and a coolant-discharge-channel forming opening 17 therein. For example, if the laser-chip-mounting plate 4 is made of ceramic, the channel-forming plates 7, 8 are made of ceramic.

The circulation channel 13 is formed in the channel-forming plate 7 so that it passes through the channel-forming plate 7 in a vertical direction thereof. The circulation channel 13 is formed so that it can be connected to the radiation-fin-forming channel 9 in the radiation-fin-forming plate 5 and the radiation-fin-forming channel 10 in the radiation-fin-forming plate 6.

The coolant-supply-channel forming opening 14 is formed in the channel-forming plate 7 so that it passes through the channel-forming plate 7 in a vertical direction thereof. The coolant-supply-channel forming opening 14 is formed relative to its position and shape so that it can be connected to the coolant-supply-channel forming opening 11 in the radiation-fin-forming plate 6 and the coolant-supply channel 10i.

The coolant-discharge-channel forming opening 15 is formed in the channel-forming plate 7 so that it passes through the channel-forming plate 7 in a vertical direction thereof. The coolant-discharge-channel forming opening 15 is formed relative to its position and shape so that it can be connected to the radiation-fin-forming channel 9 in the radiation-fin-forming plate 5 and the coolant-discharge-channel forming opening 12 in the radiation-fin-forming plate 6.

The coolant-supply-channel forming opening 16 is formed in the channel-forming plate 8 so that it passes through the channel-forming plate 8 in a vertical direction thereof. The coolant-supply-channel forming opening 16 is formed so that it can be connected to the coolant-supply-channel forming opening 11 in the radiation-fin-forming plate 6. The coolant-discharge-channel forming opening 17 is formed in the channel-forming plate 8 so that it passes through the channel-forming plate 8 in a vertical direction thereof. The coolant-discharge-channel forming opening 17 is formed so that it can be connected to the coolant-discharge-channel forming opening 12 in the radiation-fin-forming plate 6.

To form the heat sink 2, the laser-chip-mounting plate 4, the radiation-fin-forming plate 5, the channel-forming plate 7, the radiation-fin-forming plate 6, and the channel-forming plate 8 are bonded to each other using any diffusion bonding with the respective plates being stacked in turn.

This enables the radiation-fin-forming channel 9 in the radiation-fin-forming plate 5 and the radiation-fin-forming channel 10 in the radiation-fin-forming plate 6 to be connected to each other through the circulation channel 13 in the channel-forming plate 7. This also enables the coolant-discharge-channel forming opening 15 in the channel-forming plate 7, the coolant-discharge-channel forming opening 12 in the radiation-fin-forming plate 6, and the coolant-discharge-channel forming opening 17 in the channel-forming plate 8 to be connected to each other to form a discharge channel 18. The discharge channel 18 is connected to the radiation-fin-forming channel 9 in the radiation-fin-forming plate 5.

This further enables the coolant-supply-channel forming opening 14 in the channel-forming plate 7, the coolant-supply-channel forming opening 11 in the radiation-fin-forming plate 6, and the coolant-supply-channel forming opening 16 in the channel-forming plate 8 to be connected to each other to form a supply channel 19. The supply channel 19 is connected to the coolant-supply channel $10i$ of the radiation-fin-forming channel 10 in the radiation-fin-forming plate 6.

Thus, in the heat sink 2, formed is a channel 20 for a coolant in which the supply channel 19 is connected to the discharge channel 18 via the radiation-fin-forming channel 10 in the radiation-fin-forming plate 6, the circulation channel 13 in the channel-forming plate 7, and the radiation-fin-forming channel 9 in the radiation-fin-forming plate 5.

Since the heat sink 2 has the five-layer-structure as described above, the laser-chip-mounting plate 4 as the first layer, the uppermost layer, the channel-forming plate 7, as the third layer, and the channel-forming plate 8 as the fifth layer, the lowermost layer are made of one and the same material. The radiation-fin-forming plate 5 as the second layer and the radiation-fin-forming plate 6 as the fourth layer are made of one and the same material. This allows the heat sink to have a configuration that is laminated in a symmetrical manner.

Thus, even when the temperature of the plates return to the normal temperature after they have been diffusion-bonded at high temperature, it is difficult for the heat sink 2 to be bent due to any differences in the thermal expansion coefficients of the laser-chip-mounting plate 4 as the first layer, the channel-forming plates 7, 8 as the third and fifth layers, and the radiation-fin-forming plates 5, 6 as the second and fourth layers.

The semiconductor laser chip 3 is an example of the semiconductor laser element. The semiconductor laser chip 3 has a structure such that multiple light-emitting parts are arranged in a line. The laser-chip-mounting plate 4 of the heat sink 2 is mounted to the semiconductor laser chip 3 with solder.

When the laser-chip-mounting plate 4 is made of ceramic, the metal layer $4m$ is formed on an upper surface of the laser-chip-mounting plate 4 as described above. The metal layer $4m$ is electrically connected to the electrodes, which are not shown, provided on the undersurface of the semiconductor laser chip 3. Electrodes provided on an upper surface of the semiconductor laser chip 3, which are not shown, and the metal layer $4m$ are respectively connected to any separate driver devices, which are not shown, electrically by bonding wires or the like.

The semiconductor laser chip 3 mounted on the laser-chip-mounting plate 4 is positioned above the multiple radiation fins $9f$ formed in the radiation-fin-forming plate 5 and the multiple radiation fins $10f$ formed in the radiation-fin-forming plate 6.

Since the laser-chip-mounting plate 4 of the heat sink 2 is made of material having a thermal expansion coefficient, which is closer to that of the semiconductor laser chip 3, as described above, the laser-chip-mounting plate 4 and the semiconductor laser chip 3 have an almost identical rate of expansion and contraction by heat. This prevents any stress from occurring in the semiconductor laser chip 3 when the heat sink 2 bonds the semiconductor laser chip 3 with solid solder such as alloy of gold and tin.

Thus, according to this embodiment, the heat sink 2 can bond the semiconductor laser chip 3 with solid solder such as alloy of gold and tin, thereby avoiding any deterioration in the solder even if electricity flows for long time. This enables the semiconductor laser device to maintain reliability for long time.

(Description of the First Embodiment of the Semiconductor Laser Device According to the Invention)

The following describes the first embodiment of the semiconductor laser device 1A.

In the semiconductor laser device 1A, the supply channel and the discharge channel 18 are connected to a circulation device, which is not shown, for supplying and discharging a coolant, so-called "chiller".

In the heat sink 2, when the supply channel 19 receives the coolant, the coolant flows through the channel 20. The supply channel 19 is connected to the discharge channel 18 via the radiation-fin-forming channel 10 in the radiation-fin-forming plate 6, the circulation channel 13 in the channel-forming plate 7, and the radiation-fin-forming channel 9 in the radiation-fin-forming plate 5.

Thus, the coolant received by the supply channel 19 flows through the coolant-supply channel $10i$ in the radiation-fin-forming plate 6 to the radiation-fin-forming channel 10. In the radiation-fin-forming channel 10, the coolant flows in a space between the radiation fins $10f$ to the radiation-fin-forming channel 9 in the radiation-fin-forming plate 5 via the circulation channel 13 in the channel-forming plate 7. In the radiation-fin-forming channel 9, the coolant flows in a space between the radiation fins $9f$ to the discharge channel 18 from which the coolant is discharged.

The semiconductor laser chip 3 receives an electric signal from the driver device, which is not shown, and converts it to an optical signal to output. Any heat occurring at driving the semiconductor laser chip 3 is transferred to the heat sink 2 through the laser-chip-mounting plate 4. Since the coolant flows in the channel 20 of the heat sink 2, as described above, the heat transferred from the semiconductor laser chip 3 can be removed. This enables the semiconductor laser chip 3 to be cooled.

In the heat sink 2 of this embodiment, the radiation fins 9f, 10f are positioned under the mounted semiconductor laser chip 3. The radiation fins 9f, 10f can increase the area in contact with the coolant. The radiation fins 9f, 10f can generate turbulent flows. This enables any heat transferred from the semiconductor laser chip 3 to be efficiently removed.

Since the coolant flows fast under the semiconductor laser chip 3 in the heat sink 2 of micro channel type, it is possible to implement higher heat-removing efficiency because fast-flowing coolant is in contact with the undersurface of the laser-chip-mounting plate 4 on which the semiconductor laser chip 3 is mounted.

In this embodiment, the laser-chip-mounting plate 4 on which the semiconductor laser chip 3 is mounted and the undersurface which is in contact with the coolant is made of ceramic. The channel-forming plates 7, 8 are also made of ceramic. This prevents deterioration of the metal material by corrosion thereof from occurring at the points where the fast-flowing coolant is in contact with the undersurface of the laser-chip-mounting plate 4 and prohibits water from being leaked therefrom.

Further, since in this embodiment, the radiation-fin-forming plates 5, 6 are made of a metallic material that has good thermal conductivity, such as copper, it is possible to increase the heat-removing efficiency. If the radiation-fin-forming plates 5, 6 are further provided with a suitable corrosion proof region, the whole of the heat sink 2 can prevent the coolant from leaking.

In this embodiment, the laser-chip-mounting plate 4 on which the semiconductor laser chip 3 is mounted is made of ceramic. The channel-forming plate 7 between the radiation-fin-forming plates 5, 6 and the channel-forming plate 8 under the radiation-fin-forming plate 6 are made of ceramic. This configuration prohibits current for driving the semiconductor laser chip 3 from flowing in the radiation-fin-forming plates 5, 6 made of metallic material. This prevents corrosion caused by stray current by any potential difference due to internal resistance from occurring.

In the heat sink 2 of this embodiment, it is possible to bond the semiconductor laser chip 3 to the upper surface of the heat sink 2 directly with solid solder. This enables thermal resistance and electric resistance to decrease in contrast with a case where any sub mount made of another material is inserted into a mounted position of the semiconductor laser chip 3.

In this embodiment, the laser-chip-mounting plate 4, the upper surface of the heat sink 2, has a relatively low thermal conductivity in contrast with copper or the like of which the radiation-fin-forming plates 5, 6 are made. If the laser-chip-mounting plate 4 is made of the same material and has the same thickness as the laser-chip-mounting plate 4 when the sub mount is used, it is possible to decrease at least the total of thermal resistance.

(A Configuration of Second Embodiment of Semiconductor Laser Device According to the Invention)

FIG. 3 is a sectional side elevation of a second embodiment of a semiconductor laser device according to the invention for illustrating a configuration thereof.

This semiconductor laser device 1B in the second embodiment is a semiconductor laser device a of stacked type in which, for example, two semiconductor laser devices 1A in the first embodiment are stacked in a vertical direction thereof.

It is to be noted that although two semiconductor laser devices have been stacked in this embodiment, this invention is not limited to this. For example, twenty semiconductor laser devices can be stacked, thereby implementing any high-power semiconductor laser device.

The semiconductor laser device 1B in this embodiment has an upper heat sink 2A and a lower heat sink 2B each having a fine channel structure of micro channel type. The semiconductor laser chips 3A and 3B are mounted on heat sinks 2A and 2B respectively.

Figure 4:
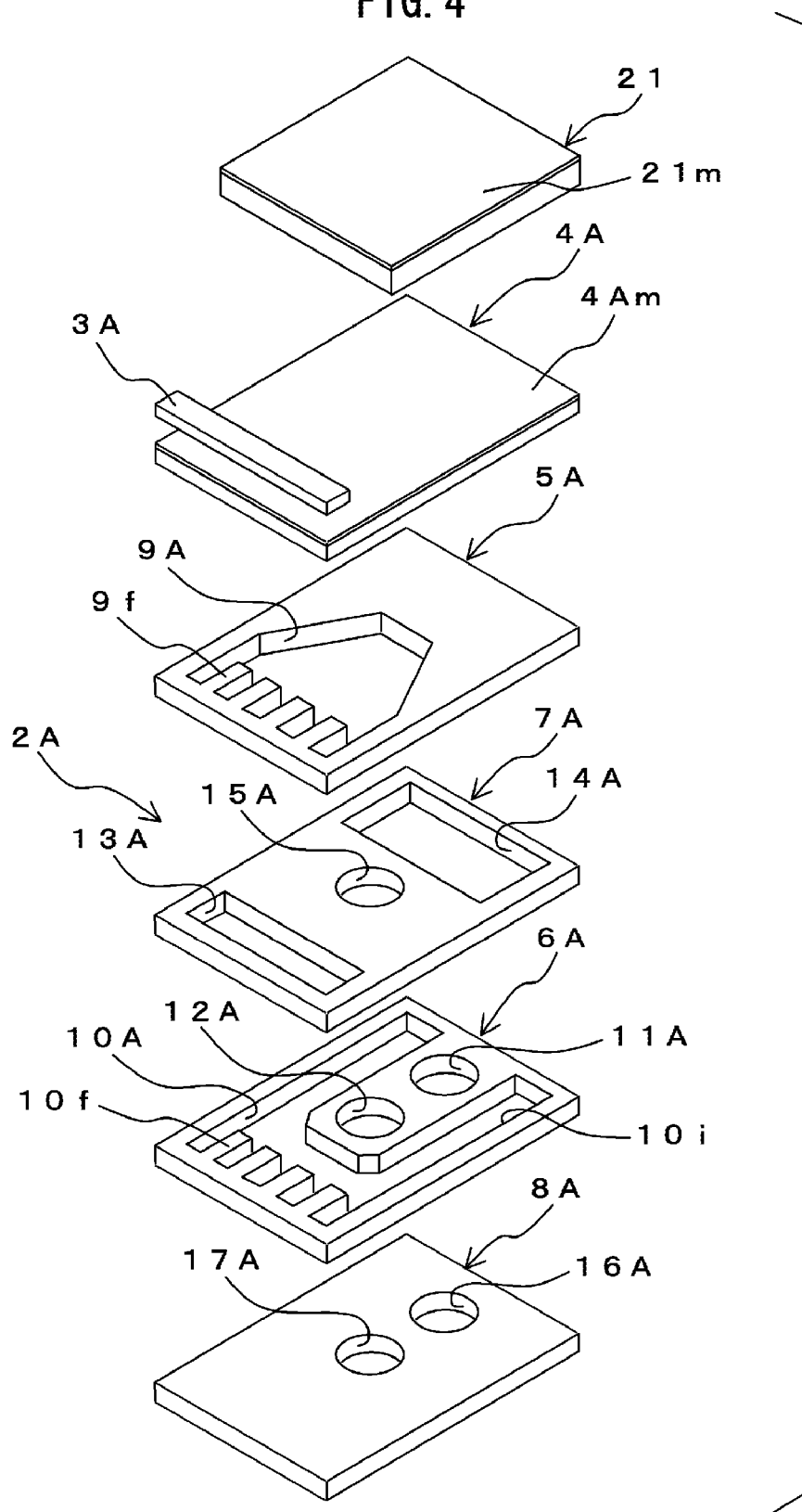
FIG. 4 is an expanded view of an upper heat sink constituting another embodiment of the semiconductor laser device according to the invention.

FIG. 4 is an expanded view of the second embodiment of the invention for illustrating a configuration of upper sink 2A.

The upper heat sink 2A has the same configuration as that of the first embodiment of the heat sink 2 shown in FIG. 1 and includes laminated thin plates. In this embodiment, the upper heat sink 2A includes the following plates as layers: a laser-chip-mounting plate 4A as a first layer; radiation-fin-forming plates 5A, 6A as second and fourth layers; and channel-forming plates 7A, 8A as third and fifth layers. The plates are bonded to each other using the diffusion bonding or the like to form the upper heat sink 2A.

The laser-chip-mounting plate 4A is made of a material, for example, ceramic, having a thermal expansion coefficient, which is closer to that of material of the semiconductor laser chip 3A. If the laser-chip-mounting plate 4A is made of ceramic that is an insulating material, a metal layer 4Am is formed on a surface thereof using rolled gold so that the metal layer 4Am and electrodes formed on a lower surface of the semiconductor laser chip 3A can be connected electrically to each other.

The radiation-fin-forming plates 5A and 6A are made of material having higher thermal conductivity, for example, copper. The radiation-fin-forming plate 5A has a radiation-fin-forming channel 9A therein. The radiation-fin-forming plate 6A has a radiation-fin-forming channel 10A, a coolant-supply-channel-forming opening 11A, and a coolant-discharge-channel-forming opening 12A therein. In this case, the radiation-fin-forming channel 9A, the radiation-fin-forming channel 10A, the coolant-supply-channel-forming opening 11A, and the coolant-discharge-channel-forming opening 12A are formed in the respective plates similar to those of the first embodiment of the heat sink 2 shown in FIG. 1.

The channel-forming plates 7A, 8A are made of same material as that of the laser-chip-mounting plate 4A. The channel-forming plate 7A has a circulation channel 13A, a coolant-supply-channel-forming opening 14A, and a coolant-discharge-channel-forming opening 15A therein. The channel-forming plate 8A has a coolant-supply-channel-forming opening 16A and a coolant-discharge-channel-forming opening 17A therein. In this case, the circulation channel 13A, the coolant-supply-forming opening 14A, the coolant-discharge-channel-forming opening 15A, the coolant-supply-channel-forming opening 16A and the coolant-discharge-channel-forming opening 17A are formed in the respective plates similar to those of the first embodiment of the heat sink 2 shown in FIG. 1.

In the upper heat sink 2A, the semiconductor laser chip 3A is mounted with solder. A spacer plate 21 is bonded to the laser-chip-mounting plate 4A on a portion thereof except for a portion where the semiconductor laser chip 3A is mounted. The spacer plate 21 is made of the same material, for example, ceramic, as that of the laser-chip-mounting plate 4A. A metal layer 21m is formed on an upper surface of the spacer plate 21 using rolled gold or the like.

When the laser-chip-mounting plate 4A is made of ceramic, the metal layer 4Am is formed on an upper surface of the laser-chip-mounting plate 4A as described above. The metal layer 4Am is electrically connected to the electrodes, which are not shown, on the undersurface of the semiconductor laser chip 3A. Electrodes provided on an upper surface of the semiconductor laser chip 3A, which are not shown, and the metal layer 21m are connected electrically by bonding wires 22.

Figure 5:
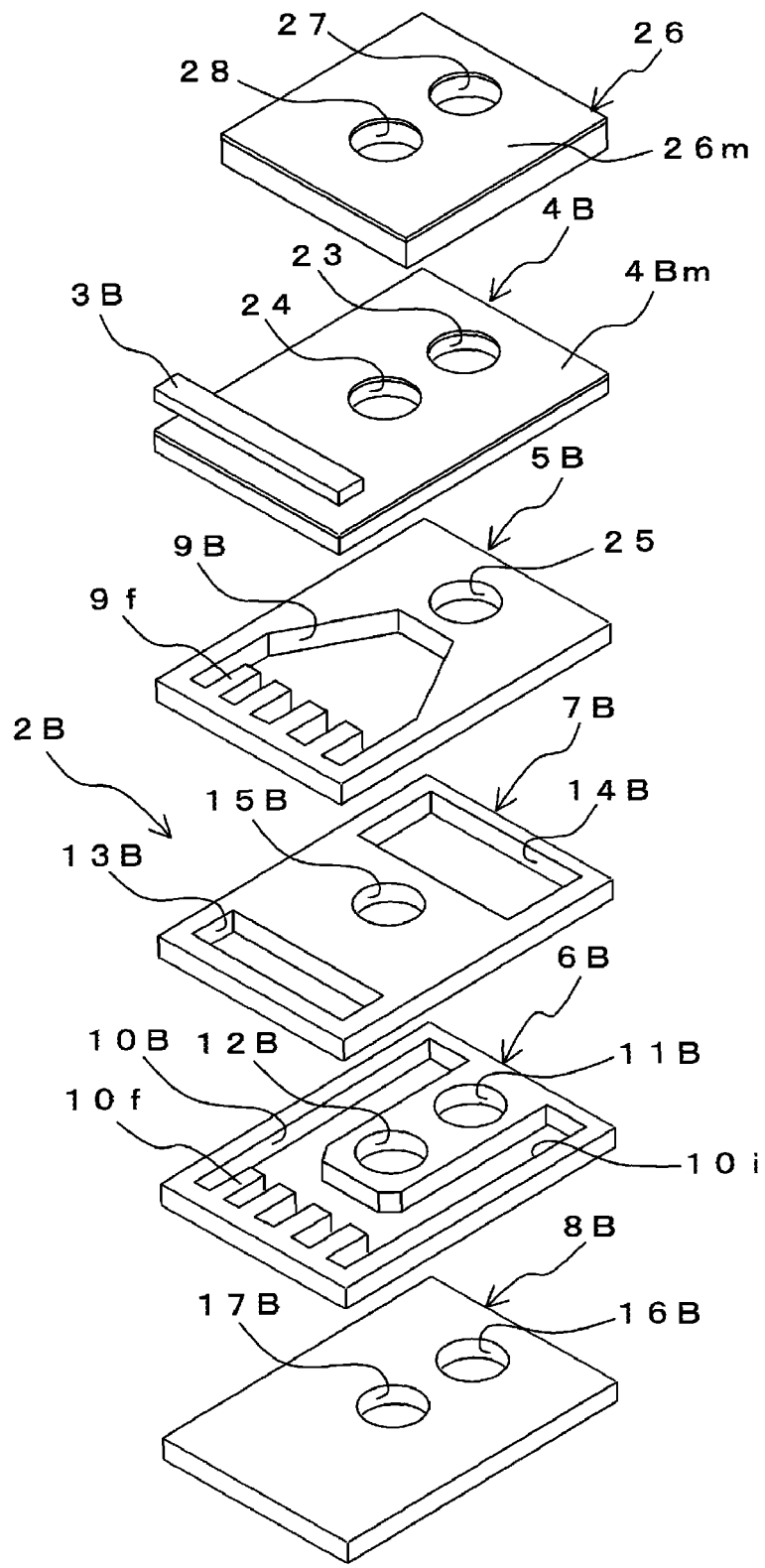
FIG. 5 is an expanded view of a lower heat sink constituting another embodiment of the semiconductor laser device according to the invention.

FIG. 5 is an expanded view of the second embodiment of the invention for illustrating a configuration of the lower heat sink 2B.

The lower heat sink 2B has the same configuration as that of the first embodiment of the heat sink 2 except for a connection part thereof to the upper heat sink 2A and includes laminated thin plates.

In this embodiment, the lower heat sink 2B includes the following plates as layers: a laser-chip-mounting plate 4B as a first layer; radiation-fin-forming plates 5B, 6B as second and fourth layers; and channel-forming plates 7B, 8B as third and fifth layers. The plates are bonded to each other using the diffusion bonding or the like to form the lower heat sink 2B.

The laser-chip-mounting plate 4B is made of a material, for example, ceramic, having a thermal expansion coefficient, which is closer to that of material of the semiconductor laser chip 3B. The laser-chip-mounting plate 4B has a coolant-supply-channel-forming opening 23 and a coolant-discharge-channel-forming opening 24 therein.

The coolant-supply-channel-forming opening 23 and the coolant-discharge-channel-forming opening 24 are formed in the laser-chip-mounting plate 4B so that they pass through the laser-chip-mounting plate 4B in a vertical direction thereof. The coolant-supply-channel-forming opening 23 is positioned so that it can be connected to the coolant-supply-channel-forming opening 16A of the upper heat sink 2A. The coolant-discharge-channel-forming opening 24 is positioned so that it can be connected to the coolant-discharge-channel-forming opening 17A of the upper heat sink 2A.

If the laser-chip-mounting plate 4B is made of ceramic that is an insulating material, a metal layer 4Bm is formed on a surface thereof using rolled gold so that the metal layer 4m and electrodes formed on a lower surface of the semiconductor laser chip 3B can be connected electrically to each other. It is to be noted that the coolant-supply-channel-forming opening 23 and the coolant-discharge-channel-forming opening 24 are formed so that they pass through the metal layer 4Bm.

The radiation-fin-forming plates 5B, 6B are made of material having higher thermal conductivity, for example, copper. The radiation-fin-forming plate 5B has a radiation-fin-forming channel 9B and a coolant-supply-channel-forming opening 25 therein. The radiation-fin-forming plate 6B has a radiation-fin-forming channel 10B, a coolant-supply-channel-forming opening 11B, and a coolant-discharge-channel-forming opening 12B therein.

The radiation-fin-forming channel 9B is formed in the radiation-fin-forming plate 5B so that it passes through the radiation-fin-forming plate 5B in a vertical direction thereof. Multiple radiation fins 9f are arranged so as to be positioned under the semiconductor laser chip 3B and are projected in a line toward the inside of the channel 9B and hence, the coolant flows in a space between the radiation fins 9f in the radiation-fin-forming channel 9B. The radiation-fin-forming channel 9B is positioned so that it can be connected to the coolant-discharge-channel-forming opening 24 in the laser-chip-mounting plate 4B.

The radiation-fin-forming channel 10B is formed in the radiation-fin-forming plate 6B so that it passes through the radiation-fin-forming plate 6B in a vertical direction thereof. Multiple radiation fins 10f are arranged so as to be positioned under the semiconductor laser chip 3 and are projected in a line toward the inside of the channel 10B and hence, the coolant flows in a space between the radiation fins 10f in the radiation-fin-forming channel 10B. The radiation-fin-forming channel 10B lengthens to form a coolant-supply channel 10i for supplying a coolant to the radiating fins 10f.

The coolant-supply-channel-forming opening 11B and the coolant-discharge-channel-forming opening 12B are respectively formed in the radiation-fin-forming plate 6B so that they pass through the radiation-fin-forming plate 6B in a vertical direction thereof. These openings 11B, 12B are separately formed from the radiation-fin-forming channel 10B in the radiation-fin-forming plate 6B.

The channel-forming plates 7B, 8B are made of same material, for example, ceramic, as that of the laser-chip-mounting plate 4B. The channel-forming plate 7B has a circulation channel 13B, a coolant-supply-channel-forming opening 14B, and a coolant-discharge-channel-forming opening 15B therein. The channel-forming plate 8B has a coolant-supply-channel-forming opening 16B and a coolant-discharge-channel-forming opening 17B therein.

The circulation channel 13B is formed in the channel-forming plate 7B so that it passes through the channel-forming plate 7B in a vertical direction thereof. The circulation channel 13B is formed so that it can be connected to the radiation-fin-forming channel 9B in the radiation-fin-forming plate 5B and the radiation-fin-forming channel 10B in the radiation-fin-forming plate 6B.

The coolant-supply-channel forming opening 14B is formed in the channel-forming plate 7B so that it passes through the channel-forming plate 7B in a vertical direction thereof. The coolant-supply-channel forming opening 14B is formed relative to its position and shape so that it can be connected to the coolant-supply-channel forming opening 25 in the radiation-fin-forming plate 5B, the coolant-supply-channel forming opening 11B in the radiation-fin-forming plate 6B, and the coolant-supply channel 10i.

The coolant-discharge-channel forming opening 15B is formed in the channel-forming plate 7B so that it passes through the channel-forming plate 7B in a vertical direction thereof. The coolant-discharge-channel forming opening 15B is formed relative to its position and shape so that it can be connected to the radiation-fin-forming channel 9B in the radiation-fin-forming plate 5B and the coolant-discharge-channel forming opening 12B in the radiation-fin-forming plate 6B.

The coolant-supply-channel forming opening 16B is formed in the channel-forming plate 8B so that it passes through the channel-forming plate 8B in a vertical direction thereof. The coolant-supply-channel forming opening 16B is formed so that it can be connected to the coolant-supply-channel forming opening 11B in the radiation-fin-forming plate 6B. The coolant-discharge-channel forming opening 17B is formed in the channel-forming plate 8B so that it passes through the channel-forming plate 8B in a vertical direction thereof. The coolant-discharge-channel forming opening 17B is formed so that it can be connected to the coolant-discharge-channel forming opening 12b in the radiation-fin-forming plate 6B.

In the lower heat sink 2B, if the laser-chip-mounting plate 4B on which the semiconductor laser chip 3B is mounted is made of ceramic and the channel forming plates 7B, 8B are made of ceramic, to make the heat sink have a configuration that is laminated in a symmetrical manner, the radiation-fin-forming plates 5B, 6B are made of material having excellent thermal conductivity, for example, copper that is diffusion-bonded to the ceramic.

In the lower heat sink 2B, the semiconductor laser chip 3B is mounted to the laser-chip-mounting plate 4B with solder or the like. A spacer plate 26 is bonded on the laser-chip-mounting plate 4B on a portion thereof except for a portion where the semiconductor laser chip 3B is mounted. The spacer plate 26 is made of the same material, for example, ceramic, as that of the laser-chip-mounting plate 4B. A metal layer 26m is formed on an upper surface of the spacer plate 26 using rolled gold or the like.

The spacer plate 26 has a coolant-supply-channel forming opening 27 and a coolant-discharge-channel forming opening 28 therein. The coolant-supply-channel forming opening 27 is formed so that it can be connected to the coolant-supply-channel forming opening 23 in the laser-chip-mounting plate 4B. The coolant-discharge-channel forming opening 28 is formed so that it can be connected to the coolant-discharge-channel forming opening 24 in the laser-chip-mounting plate 4B.

When the laser-chip-mounting plate 4B is made of ceramic, the metal layer 4Bm is formed on an upper surface of the laser-chip-mounting plate 4B as described above. The metal layer 4Bm is electrically connected to the electrodes, which are not shown, on the undersurface of the semiconductor laser chip 3B. Electrodes on an upper surface of the semiconductor laser chip 3B, which are not shown, and the metal layer 26m are connected electrically by bonding wires 29.

To form the upper heat sink 2A, the laser-chip-mounting plate 4A, the radiation-fin-forming plate 5A, the channel-forming plate 7A, the radiation-fin-forming plate 6A, and the channel-forming plate 8A are bonded to each other using any diffusion bonding with the respective plates being stacked in turn. In the upper heat sink 2A, the spacer plate 21 is bonded to the laser-chip-mounting plate 4A.

This enables the radiation-fin-forming channel 9A in the radiation-fin-forming plate 5A and the radiation-fin-forming channel 10A in the radiation-fin-forming plate 6A to be connected to each other through the circulation channel 13A in the channel-forming plate 7A in the upper heat sink 2A. This also enables the coolant-discharge-channel forming opening 15A in the channel-forming plate 7A, the coolant-discharge-channel forming opening 12A in the radiation-fin-forming plate 6A, and the coolant-discharge-channel forming opening 17A in the channel-forming plate 8A to be connected to each other to form a discharge channel 18A. The discharge channel 18A is connected to the radiation-fin-forming channel 9A in the radiation-fin-forming plate 5A.

This further enables the coolant-supply-channel forming opening 14A in the channel-forming plate 7A, the coolant-supply-channel forming opening 11A in the radiation-fin-forming plate 6A, and the coolant-supply-channel forming opening 16A in the channel-forming plate 8A to be connected to each other to form a supply channel 19A. The supply channel 19A is connected to the coolant-supply channel 10i of the radiation-fin-forming channel 10A in the radiation-fin-forming plate 6A.

To form the lower heat sink 2B, the laser-chip-mounting plate 4B, the radiation-fin-forming plate 5B, the channel-forming plate 7B, the radiation-fin-forming plate 6B, and the channel-forming plate 8B are bonded to each other using any diffusion bonding with the respective plates being stacked in turn. In the lower heat sink 2B, the spacer plate 26 is bonded to the laser-chip-mounting plate 4B.

This enables the radiation-fin-forming channel 9B in the radiation-fin-forming plate 5B and the radiation-fin-forming channel 10B in the radiation-fin-forming plate 6B to be connected to each other through the circulation channel 13B in the channel-forming plate 7B in the lower heat sink 2B.

This also enables the coolant-discharge-channel forming opening 28 in the spacer plate 26, the coolant-discharge-channel forming opening 24 in the laser-chip-mounting plate 4B, the radiation-fin-forming channel 9B in the radiation-fin-forming plate 5B, the coolant-discharge-channel forming opening 15B in the channel-forming plate 7B, the coolant-discharge-channel forming opening 12B in the radiation-fin-forming plate 6B, and the coolant-discharge-channel forming opening 17B in the channel-forming plate 8B to be connected to each other to form a discharge channel 18B.

This further enables the coolant-supply-channel forming opening 27 in the spacer plate 26, the coolant-supply-channel forming opening 23 in the laser-chip-mounting plate 4B, the coolant-supply-channel forming opening 25 in the radiation-fin-forming plate 5B, the coolant-supply-channel forming opening 14B in the channel-forming plate 7B, the coolant-supply-channel forming opening 11B in the radiation-fin-forming plate 6B, and the coolant-supply-channel forming opening 16B in the channel forming plate 8B to be connected to each other to form a supply channel 19B. The supply channel 19B is connected to the radiation-fin-forming channel 10B in the radiation-fin-forming plate 6B via the coolant-supply-channel forming opening 14B in the channel-forming plate 7B and the coolant-supply channel 10i of the radiation-fin-forming plate 6B.

Thus, the upper heat sink 2A and the lower heat sink 2B are bonded with the discharge channels 18A, 18B and the supply channels 19A, 19B being sealed by O-ring 30. This enables the upper heat sink 2A and the lower heat sink 2B to be connected to each other, thereby forming a channel 31.

Since the upper heat sink 2A includes the five-layer-structure as described above, the laser-chip-mounting plate 4A as the first layer, the uppermost layer thereof, the channel-forming plate 7A as the third layer, and the channel-forming plate 8A as the fifth layer, the lowermost layer thereof are made of one and the same material. The radiation-fin-forming plate 5A as the second layer and the radiation-fin-forming plate 6A as the fourth layer are made of the same material. This allows the heat sink 2A to have a configuration that is laminated in a symmetrical manner.

Since the lower heat sink 2B includes the five-layer-structure as described above, the laser-chip-mounting plate 4B as the first layer, the uppermost layer thereof, the channel-forming plate 7B as the third layer, and the channel-forming plate 8B as the fifth layer, the lowermost layer thereof are made of the same material. The radiation-fin-forming plate 5B as the second layer and the radiation-fin-forming plate 6B as the fourth layer are made of one and the same material. This allows the lower heat sink 2B to have a configuration that is laminated in a symmetrical manner.

Thus, even when the temperature of the plates return to the normal temperature after they have been diffusion-bonded at high temperature, it is difficult for the upper and lower heat sinks 2A, 2B to be bent due to any differences in the thermal expansion coefficients of the respective plates constituting the layers.

Relative to electric connection of the semiconductor laser chip 3 in the semiconductor laser device 1B, in the upper heat sink 2A, the metal layer 21m of the spacer plate 21 that is connected to the upper electrodes, which is not shown, of the semiconductor laser chip 3A is connected to the power supply of the driver device 32 or the like. In the lower heat sink 2B, the metal layer 4Bm of the laser-chip-mounting plate 4B that is connected to the lower electrodes, which is not shown, of the semiconductor laser chip 3B is also connected to the power supply of the driver device 32 or the like.

Further, the metal layer 4Am of the laser-chip-mounting plate 4A that is connected to the lower electrodes, which is not shown, of the semiconductor laser chip 3A in the upper heat sink 2A and the metal layer 26m of the spacer plate 26 that is connected to the upper electrodes, which is not shown, of the semiconductor laser chip 3B in the lower heat sink 2B are connected to each other by bonding wires 33.

This enables electric current to flow in the upper and lower semiconductor laser chips 3A, 3B in series from the driver device 32.

The laser-chip-mounting plate 4A of the upper heat sink 2A is made of material having a thermal expansion coefficient, which is closer to that of the semiconductor laser chip 3A. This prevents any stress from occurring in the semiconductor laser chip 3A when the upper heat sink 2A bonds the semiconductor laser chip 3A with solid solder such as alloy of gold and tin. Thus, according to this embodiment, it is possible to avoid any deterioration in the solder even if electricity flows for long time. This enables the semiconductor laser device to maintain reliability for long time.

Similarly, the laser-chip-mounting plate 4B of the lower heat sink 2B is made of material having a thermal expansion coefficient, which is closer to that of the semiconductor laser chip 3B. This prevents any stress from occurring in the semiconductor laser chip 3B when the lower heat sink 2B bonds the semiconductor laser chip 3B with solid solder such as alloy of gold and tin. Thus, according to this embodiment, it is possible to avoid any deterioration in the solder even if electricity flows for long time. This enables the semiconductor laser device to maintain reliability for long time.

(Description of the Second Embodiment of the Semiconductor Laser Device According to the Invention)

The following will describe the second embodiment of the semiconductor laser device 1B.

In the semiconductor laser device 1B, the supply channel 19B and the discharge channel 18B in the lower heat sink 2B are connected to a circulation device, which is not shown, for supplying and discharging a coolant.

In the lower heat sink 2B, when the supply channel 19B receives the coolant, a portion of the coolant flows toward the radiation-fin-forming channel 10B in the radiation-fin-forming plate 6B via the coolant-supply channel 10i therein. In the radiation-fin-forming channel 10B, the coolant flows in a space between the radiation fins 10f to the radiation-fin-forming channel 9B in the radiation-fin-forming plate 5B via the circulation channel 13B in the channel-forming plate 7B. In the radiation-fin-forming channel 9B, the coolant flows in a space between the radiation fins 9f to the discharge channel 18B from which the coolant is discharged.

When the supply channel 19B receives the coolant, the other portion of the coolant passes through the supply channel 19B to reach the supply channel 19A in the upper heat sink 2A. When the supply channel 19A receives the coolant, this portion of the coolant flows toward the radiation-fin-forming channel 10A in the radiation-fin-forming plate 6A via the coolant-supply channel 10i therein. In the radiation-fin-forming channel 10A, the coolant flows in a space between the radiation fins 10f to the radiation-fin-forming channel 9A in the radiation-fin-forming plate 5A via the circulation channel 13A in the channel-forming plate 7A. In the radiation-fin-forming channel 9A, the coolant flows in a space between the radiation fins 9f from the discharge channel 18A to the discharge channel 18A of the lower heat sink 2B from which the coolant is discharged.

Each of the semiconductor laser chips 3A, 3B receive an electric signal from the driver device 32 and converts it to an optical signal to output it. It is to be noted that a lens, which is not shown, condenses the optical signal irradiated from any of the semiconductor laser chips 3A, 3B to make incident on an optical fiber, for example, thereby obtaining an optical signal with high-power.

Any heat occurring at driving the semiconductor laser chip 3A is transferred to the upper heat sink 2A through the laser-chip-mounting plate 4A. Since the coolant flows in the channel 31, as described above, in the upper heat sink 2A, the heat transferred from the semiconductor laser chip 3A can be removed. This enables the semiconductor laser chip 3A to be cooled.

Similarly, any heat occurring at driving the semiconductor laser chip 3B is almost transferred to the lower heat sink 2B through the laser-chip-mounting plate 4B. Since the coolant flows in the channel 31, as described above, in the lower heat sink 2B, the heat transferred from the semiconductor laser chip 3B can be removed. This enables the semiconductor laser chip 3B to be cooled.

In this embodiment, the coolant flows fast under the semiconductor laser chips 3A and/or 3B in the upper and lower heat sinks 2A, 2B of micro channel type and hence, it is possible to increase heat-removing efficiency.

In the upper heat sink 2A, the laser-chip-mounting plate 4A which is contact with the semiconductor laser chip 3A is mounted and the undersurface of which is in contact with the coolant is made of ceramic as well as the channel-forming plates 7A, 8A are made of ceramic. This prevents deterioration of the metal material by corrosion thereof from occurring at the points where the fast-flowing coolant is in contact with the laser-chip-mounting plate and prohibits water from being leaked therefrom.

Further, in this embodiment, the radiation-fin-forming plates 5A, 6A are made of metallic material that has good thermal conductivity such as copper, and hence, it is possible to increase heat-removing efficiency. If the radiation-fin-forming plates 5A, 6A are further provided with a suitable corrosion proof region, the whole of the upper heat sink 2A can prevent the coolant from leaking.

In the lower heat sink 2B, similar to a case of the upper heat sink 2A, the laser-chip-mounting plate 4B on which the semiconductor laser chip 3B is mounted and the undersurface which is in contact with the coolant is made of ceramic as well as the channel-forming plates 7B, 8B are made of ceramic. This prevents deterioration of the metal material by corrosion thereof from occurring at the points where the fast-flowing coolant is in contact with the undersurface of the laser-chip-mounting plate and prohibits water from being leaked therefrom.

Further, in this embodiment, the radiation-fin-forming plates 5B, 6B are made of metallic material that has good thermal conductivity such as copper, and hence, it is possible to enhance heat-removing efficiency. If the radiation-fin-forming plates 5B, 6B are further provided with a suitable corrosion proof region, the whole of the lower heat sink 2B can prevent the coolant from leaking.

The upper heat sink 2A and the lower heat sink 2B are bonded with the discharge channels 18A, 18B and the supply channels 19A, 19B being sealed by O-ring 30. This may prevent the coolant from leaking out of the whole of heat sink.

In the upper heat sink 2A, the laser-chip-mounting plate 4A on which the semiconductor laser chip 3A is mounted is made of ceramic that is insulating material and the metal layer 4Am on the laser-chip-mounting plate 4A is electrically connected to the semiconductor laser chip 3A. The channel-forming plate 7A provided between the radiation-fin-forming plates 5A, 6A and the channel-forming plate 8A provided under the radiation-fin-forming plate 6A are made of ceramic that is insulating material. This configuration prohibits current for driving the semiconductor laser chip 3A from flowing in the radiation-fin-forming plates 5A, 6A made of metallic material.

Similarly, in the lower heat sink 2B, the laser-chip-mounting plate 4B on which the semiconductor laser chip 3B is mounted is made of ceramic that is insulating material and the metal layer 4Bm on the laser-chip-mounting plate 4B is electrically connected to the semiconductor laser chip 3B. The channel-forming plate 7B between the radiation-fin-forming plates 5B, 6B and the channel-forming plate 8B under the radiation-fin-forming plate 6B are made of ceramic that is insulating material. This configuration prohibits current for driving the semiconductor laser chip 3B from flowing in the radiation-fin-forming plates 5B, 6B made of metallic material.

This enables electric potential of each of the radiation-fin-forming plates 5A, 6A of the upper heat sink 2A and the radiation-fin-forming plates 5B, 6B of the upper heat sink 2A is separated from each of the semiconductor laser chips 3A, 3B and fixed by the supplied coolant. This allows the respective radiation-fin-forming plates made of metallic material that is in contact with the coolant to become equipotential, thereby preventing electric corrosion due to any potential difference between the upper and lower heat sinks from occurring.

Thus, in this embodiment, it is possible to prevent the electric corrosion from occurring at the metallic plates without purifying the coolant, thereby managing the coolant easily, in contrast with a where the coolant, water, is purified and electric conductivity is decreased, thereby preventing the electric corrosion by potential difference of the upper and lower heat sinks from occurring.

In this embodiment, if the laser-chip-mounting plates 4A, 4B are made of ceramic and power is supplied to each of the semiconductor laser chips 3A, 3B through the metal layers 4Am, 4Bm provided on the laser-chip-mounting plates 4A, 4B, large amount of current can flow in such the thin metal layers 4Am, 4Bm, so that operation voltage of the semiconductor laser device is increased based on a voltage drop due to it.

If so, in this embodiment, the metal layers 4Am, 4Bm are made using rolled gold and thus, thickness thereof is increased so that no voltage drop may occur. Further, in this embodiment, the laser-chip-mounting plates 4A, 4B, and the channel-forming plates 7A, 8A, 7B, 8B can be made of ceramic and a metal layer can be formed on side surfaces of the upper and lower heat sinks 2A, 2B so that they can be connected to each other.

Additionally, the upper and lower heat sinks 2A, 2B can be connected to each other via any opening made in the upper and lower heat sinks 2A and 2B. If the upper and lower heats sinks 2A and 2B are connected, the radiation-fin-forming plates 5A, 5B, 6A, 6B that are in contact with the coolant become equipotential with the semiconductor laser chips 3A, 3B, thereby generating any potential difference between the upper and lower heat sinks 2A, 2B. This embodiment prevents deterioration of the metal material by corrosion thereof from occurring at points where the fast-flowing coolant is in contact with the undersurface of the laser-chip-mounting plate and prohibits water from being leaked therefrom when the laser-chip-mounting plates 4A, 4B are made of ceramic.

Still further, in this embodiment, the laser-chip-mounting plates 4A, 4B can be made of metallic material with electric conductivity. If so, the laser-chip-mounting plate 4A, 4B and the channel-forming plates 7A, 7B, 8A, 8B are made of material having higher electropositive potential than those of the radiation-fin-forming plates 5A, 5B, 6A, 6B. Since the laser-chip-mounting plate 4A, 4B can be made of metallic material, the radiation-fin-forming plates 5A, 5B, 6A, 6B that are contacted with the coolant become equipotential with the semiconductor laser chips 3A, 3B, thereby generating any potential difference between the upper and lower heat sinks 2A, 2B. In this embodiment, however, the laser-chip-mounting plates 4A, 4B are made of material having higher electropositive potential than those of the radiation-fin-forming plates 5A, 5B, 6A, 6B, so that the radiation-fin-forming plates 5A, 5B, 6A, 6B can become sacrifice electrodes, thereby preventing any corrosion from occurring at the lower portions of the laser-chip-mounting plates 4A, 4B to which fast-flown coolant is connected. In this case, inner sides of the radiation-fin-forming plates 5A, 5B, 6A, 6B can be corroded. If so, in this embodiment, the channel lasts longer than that of a case where the heat sink is made of metal only and hence, the portions of radiation-fin-forming plates 5A, 5B, 6A, 6B that are connected with the channels lasts longer so that resistance of the radiation-fin-forming plates 5A, 5B, 6A, 6B is increased to make current decreased, thereby enabling a degree of corrosion in the radiation-fin-forming plates 5A, 5B, 6A, 6B and the like to be reduced.

It is preferable to apply these embodiments to a high-power semiconductor laser device that is used for processing a welding, a disconnecting or the like.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor laser device comprising:
   a semiconductor laser element; and
   a heat sink comprising (a) a plurality of plates, and (b) a channel in the heat sink for a coolant to flow therein, the plurality of plates include, in this order, at least
   (i) a mounting plate on which the semiconductor laser element is mounted,
   (ii) a first radiation-fin-forming plate having a plurality of first radiation fins that extend into a portion of the channel,
   (iii) a channel forming plate having (a) a circulation channel and (b) a first portion of a coolant supplying channel forming hall, and
   (iv) a second radiation-fin-forming plate having (a) a plurality of second radiation fins that extend into a portion of the channel, (b) a second portion of the coolant supplying channel forming hall that overlaps the first portion of the coolant supplying channel forming hall, and (c) coolant supplying channels that extend from the plurality of second radiation fins and overlap the first portion of the coolant supplying channel forming hall,
   wherein,
      the mounting plate comprises a material having a thermal expansion coefficient closer to that of the semiconductor element than that of the first radiation-fin-forming plate,
      the circulation channel comprises an opening that extends across each of the plurality of first radiation fins of the first radiation-fin-forming plate, and also extends across each of the plurality of second radiation fins of the second radiation-fin-forming plate,
      the circulation channel is positioned between the first and second radiation-fin-forming plates such that the circulation channel enables the coolant to flow between the plurality of first radiation fins of the first radiation-fin-forming plate and the plurality of second radiation fins of the second radiation-fin-forming plate, and at least one of the first and second radiation-fin-forming plates comprises a corrosion proof region that is configured to be in contact with the coolant.

2. The semiconductor laser device according to claim 1, wherein, the channel-forming plate comprises the same material as that of the mounting plate.

3. The semiconductor laser device according to claim 1, wherein the mounting plate comprises a ceramic material.

4. The semiconductor laser device according to claim 3, wherein the first radiation-fin-forming plate comprises copper and is diffusion-bonded to the ceramic mounting plate.

5. The semiconductor laser device according to claim 3, wherein a metal layer is on the mounting plate, the metal layer effective to connect to the semiconductor laser element electrically.

6. The semiconductor laser device according to claim 1, wherein the mounting plate comprises a metallic material selected from a group of Kovar and copper-tungsten alloy.

7. The semiconductor laser device according to claim 1, wherein multiple sets of the heat sinks are stacked.

8. The semiconductor laser device according to claim 7, wherein, at least one of a lower surface of the mounting plate and the channel-forming plate comprises a material having higher electropositive potential than that of the first radiation-fin-forming plate.

9. The semiconductor laser device according to claim 1, wherein, a lower surface of the mounting plate and the channel-forming plate comprise an insulating material.

10. The semiconductor laser device of claim 1, wherein:

the first radiation-fin forming plate and the second radiation-fin forming plate are formed of the same metalllic material, the channel forming plate is formed of a different material than that of the first and second radiation-fin forming plates.

11. A semiconductor laser device comprising:
a semiconductor laser element; and
a heat sink comprising (a) a plurality of plates, and (b) a channel in the heat sink for a coolant to flow therein, the plurality of plates include, in this order, at least
  (i) a mounting plate on which the semiconductor laser element is mounted,
  (ii) a first radiation-fin-forming plate having (a) a plurality of first radiation fins that extend into a portion of the channel, and (b) a radiation fin forming channel,
  (iii) a channel forming plate having (a) a circulation channel, and (b) a first portion of a coolant supplying channel forming hall, and
  (iv) a second radiation-fin-forming plate having (a) a plurality of second radiation fins that extend into a portion of the channel, (b) a second portion of the coolant supplying channel forming hall that overlaps the first portion of the coolant supplying channel forming hall, and (c) coolant supplying channels that extend from the plurality of second radiation fins and overlap the first portion of the coolant supplying channel forming hall,
wherein,
  the channel is configured such that the coolant can flow first in a first direction through the second radiation-fin-forming plate in second portion of the coolant-supplying channel forming hall; then in second and third opposite directions which are orthogonal to the first direction in the first portion of the coolant-supplying channel forming hall; then in a fourth direction orthogonal to the first, second and third directions along two parallel coolant supplying channels in the second radiation-fin-forming plate; then in the first direction through the circulation channel in the channel-forming plate to the first radiation-fin-forming plate; then in a fifth direction parallel to but opposite the fourth direction in the radiation fin forming channel in the first radiation-fin-forming plate; and then in a sixth direction parallel to but opposite the first direction through the channel-forming plate and the second radiation-fin-forming plate.

* * * * *